United States Patent
Henkel

(10) Patent No.: US 7,346,102 B2
(45) Date of Patent: Mar. 18, 2008

(54) CHANNEL WITH DOMAIN CROSSING

(75) Inventor: Thomas Henkel, Boeblingen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 663 days.

(21) Appl. No.: 10/917,966

(22) Filed: Aug. 13, 2004

(65) Prior Publication Data

US 2005/0069030 A1    Mar. 31, 2005

(30) Foreign Application Priority Data

Sep. 17, 2003    (EP) ................................. 03020983

(51) Int. Cl.
      *H04B 3/46*    (2006.01)
(52) U.S. Cl. .................................... 375/224
(58) Field of Classification Search ............... 375/224, 375/225, 227, 228, 372; 324/750, 755, 763, 324/764; 713/500, 501; 714/723, 731, 744
See application file for complete search history.

(56) References Cited

U.S. PATENT DOCUMENTS

| | | | |
|---|---|---|---|
| 5,311,486 A | 5/1994 | Alton et al. ................... 368/10 |
| 5,448,715 A | 9/1995 | Lelm et al. ................... 395/550 |
| 6,055,644 A | 4/2000 | Henkel ........................ 713/500 |
| 6,553,529 B1 | 4/2003 | Reichert ...................... 714/738 |
| 6,590,826 B1 | 7/2003 | Sawyer ................... 365/230.03 |
| 2002/0173926 A1* | 11/2002 | McCord ...................... 702/120 |
| 2003/0194037 A1* | 10/2003 | Ono et al. ................... 375/372 |

FOREIGN PATENT DOCUMENTS

| EP | 0 228 332 | 8/1987 |
|---|---|---|
| JP | 10091394 | 12/1996 |

OTHER PUBLICATIONS

European Office Action dated Aug. 4, 2006.

* cited by examiner

*Primary Examiner*—Sam K. Ahn

(57) ABSTRACT

A channel adapted for at least one of providing and receiving signals comprises a channel clock domain, whereby said channel clock domain is under clock control of a channel clock. The channel clock domain comprises at least one of: a drive path adapted for providing signals and a receive path adapted for receiving signals. The channel further comprises a service clock domain adapted for at least one of providing data to and receiving data from said channel clock domain, whereby said service clock domain is under clock control of a service clock.

11 Claims, 1 Drawing Sheet

CHANNEL WITH DOMAIN CROSSING

BACKGROUND OF THE INVENTION

The present invention relates to a channel adapted for at least one of providing and receiving signals. Furthermore, the invention relates to an automated test equipment (ATE) adapted for testing at least one device under test (DUT), and to a method for supplying clock signals on a channel.

Due to the ever-increasing level of integration, a device under test (DUT) might comprise a multitude of different functional units. For testing a DUT of this kind, a multitude of different clock frequencies might be required. The channels of an ATE therefore have to be capable of generating the respective channel clock frequencies required for testing the DUT. In this respect, it might be necessary to switch off and reprogram said channels' clocks. The present invention is by no means restricted to the field of testing, though. It can be applied to any kind of channel adapted for at least one of providing and receiving signals.

SUMMARY OF THE INVENTION

It is an object of the invention to improve the operability of a channel. The object is solved by the independent claims. Preferred embodiments are shown by the dependent claims.

The channel according to an embodiment of the present invention is adapted for at least one of providing and receiving signals. The channel comprises a channel clock domain that is under clock control of a channel clock. The channel clock domain comprises at least one of: a drive path adapted for providing signals and a receive path adapted for receiving signals. The channel further comprises a service clock domain, with said service clock domain being under clock control of a service clock. The service clock domain is adapted for at least one of providing data to and receiving data from said channel clock domain.

During operation of the channel, it might be necessary to disable said channel clock for a certain period of time or to reprogram said channel clock. The frequency of the channel clock might have to be varied within a range of frequencies between e.g. several kHz up to several hundred MHz, or even GHz.

In prior art solutions, the entire channel has been under clock control of the channel clock. In this case, if the channel comprises any kind of memory, it will be necessary to set said memory to a power down mode before switching off the channel clock, because otherwise, the memory's content might be lost.

According to embodiments of the present invention, a service clock domain is additionally implemented on said channel, with said service clock domain comprising one or more of the channel's functional units. The service clock domain is under clock control of a service clock. By means of a service clock domain, a stable operation of the channel's functional units is accomplished. The service clock is adapted for providing a smooth and continuous operation of the functional units within the service clock domain.

In contrast to the channel clock, which might vary within a wide range of frequencies, the service clock might e.g. be set to a constant frequency that is chosen in accordance with the respective needs of said functional units. Even if the channel clock is consecutively set to various different clock frequencies, the service clock will provide for a continuous and reliable operation of the functional units of the service clock domain. It can be avoided that the channel's functional units are exposed to a wide range of different clock frequencies.

For example, the service clock might remain enabled during periods of time when the channel clock is switched off or disabled. If the service clock domain comprises a memory, it will no longer be necessary to set said memory to a power down mode.

In case the channel comprises a drive path adapted for providing signals, said drive path is still controlled, as in prior art solutions, by the channel clock. At the channel's output, the channel's output signals are obtained in accordance with the channel clock. In case the channel comprises a receive path, said receive path is still controlled, as in prior art solutions, by the channel clock. As a consequence, signals are received by said channel in accordance with the channel clock.

In a preferred embodiment of the invention, the service clock remains enabled whenever the frequency of the channel clock is set to a different value. The functional units within the service clock domain may continue operating. In case the service clock domain comprises any kind of memory, the operation of said memory is not interrupted. A more stable operation of the channel is accomplished. Besides that, the frequency of the channel clock can be reprogrammed more quickly.

According to another embodiment of the invention, the service clock might remain enabled when the channel clock is switched off. Thus, the operation of the functional units within the service clock domain can be maintained. In particular, memory units within the service clock domain do not have to be set to a power down mode.

In another embodiment of the invention, the service clock remains active when the time settings of at least one of the drive path and the receive path are reprogrammed. For example, during a predetermined time interval, the channel clock might be disabled, and new time settings might be written into the respective registers of at least one of the drive path and the receive path. Then, the channel clock might be re-enabled, and further on, the new time settings will be used. During the entire procedure, the service clock may remain enabled, and hence, the operation of the functional units within the service clock domain does not have to be interrupted.

According to a preferred embodiment of the invention, the channel comprises a channel clock gate that is responsible for enabling and disabling the channel clock. For example, said channel clock gate might disable the channel clock for a certain period of time, in order to allow for reprogramming the time settings. After the new time settings have been written to the respective registers, the channel clock gate might re-enable the channel clock. The channel clock gate allows for a precise control of the channel clock. Furthermore, the operations of multiple channels may be synchronized by means of the channels' clock gates.

In a preferred embodiment, the service clock domain may provide data to the channel clock domain at a data rate that exceeds the data rate of the channel clock domain. Hence, the channel clock domain is continuously supplied with data, and for this reason, disruptions of the channel's output data stream will not occur. In the opposite direction, data received by the channel's receive path might e.g. be forwarded to the service clock domain, in order to analyze said data. If the data rate of the service clock domain exceeds the data rate of the channel clock domain, the received data can be taken care of immediately, and data loss is avoided.

In another preferred embodiment of the invention, data is transferred, via at least one first domain crossing buffer, from the service clock domain to the channel clock domain. Data provided by the service clock domain may be buffered in said first domain crossing buffer until it is read out by the channel clock domain.

Preferably, data from the service clock domain is written to the first domain crossing buffer in accordance with the service clock. Further, preferably, data is read from the first domain crossing buffer in accordance with the channel clock. Though the data rate of the service clock domain might not be equal to the data rate of the channel clock domain, a reliable data transfer from the service clock domain to the channel clock domain can be accomplished. Thus, the first domain crossing buffer acts as a speed matching buffer. Preferably, the first domain crossing buffer is realized as a FIFO (First In First Out) buffer, in order to preserve the order of the data transferred to the channel clock domain.

According to another preferred embodiment, an interrupt is initiated whenever the first domain crossing buffer becomes empty. If the first domain crossing buffer becomes empty, the channel's drive path will no longer be supplied with an input data stream, and as a consequence, the channel's output data stream might get disrupted. For this reason, if the first domain crossing buffer becomes empty, this situation will be indicated by means of an interrupt.

According to another embodiment of the invention, the channel comprises a second domain crossing buffer adapted for buffering result data received from the channel clock domain. For example, the channel's receive path might provide result data to said second domain crossing buffer. If the result data provided by the channel clock domain cannot be taken care of immediately, said result data will be buffered in the second domain crossing buffer. Hence, said result data will not get lost. The second domain crossing buffer allows for a secure transfer of result data from the channel clock domain to the service clock domain, even though the bandwidth of the channel clock domain might differ from the bandwidth of the service clock domain. Preferably, result data is written to the second domain crossing buffer in accordance with the channel clock, and result data is read from said second domain crossing buffer in accordance with the service clock. Therefore, the second domain crossing buffer can be considered as a clock matching buffer. Preferably, the second domain crossing buffer is realized as a FIFO buffer. Thus, the order of the data transferred to the service clock domain is preserved.

According to a preferred embodiment, an interrupt is initiated whenever the second domain crossing buffer is full. In this case, the service clock domain has not been capable of reading out the result data in due time. As a consequence, new result data provided by the channel's receive path can no longer be written to the second domain crossing buffer, and said result data might get lost. For this reason, it is advantageous to initiate an interrupt whenever the second domain crossing buffer is completely filled.

In a preferred embodiment, the service clock domain might comprise at least one of: a sequencer unit, a memory unit, a microprocessor core, a result processing unit, and an interface module. For example, the sequencer unit might be supplied with at least one of instructions and data from a memory unit in order to generate an output data stream. Said output data stream, or a data stream derived there from, might e.g. be provided to the channel clock domain. The service clock domain might further comprise a result processing unit, whereby said result processing unit might e.g. be adapted for evaluating result data obtained from the service clock domain. The service clock domain might further comprise an interface module, with said interface module being e.g. adapted for establishing a data link between the channel and a central facility. Via said interface module, data might e.g. be exchanged between the channel's memory unit and the central facility. Besides that, the channel might e.g. comprise a microprocessor core.

If the above mentioned functional units are part of the service clock domain, a more stable and reliable operation of said functional units can be accomplished, because the service clock is not subjected to reprogramming or frequency switching. The service clock is permanently enabled, and for this reason, it is no longer necessary to set the memory unit to a power down mode each time the channel clock is disabled.

In a preferred embodiment, the sequencer unit generates a data stream, and said data stream, or a data stream derived there from, is written to the at least one first domain crossing buffer. Via the first domain crossing buffer, the respective data stream is provided to at least one of the drive path and the receive path. Though the sequencer unit is part of the service clock domain and the drive path and receive path are part of the channel clock domain, a reliable data exchange is achieved.

The drive path might e.g. convert said data stream into the channel's output data stream. The receive path might e.g. compare a received data stream with expected data obtained from the first domain crossing buffer. By performing this comparison, data streams received by the channel can be evaluated.

According to a preferred embodiment, the sequencer unit stops writing data to the first domain crossing buffer as soon as said buffer is full. This kind of flow control prevents overflow of the first domain crossing buffer.

In yet another preferred embodiment, the receive path writes data to the second domain crossing buffer, and said second domain crossing buffer is accessed by the result processing unit. By means of the second domain crossing buffer, data can be transferred from the channel's receive path to the result processing unit.

In a preferred embodiment, the channel is a channel of an automated test equipment that is adapted for testing at least one DUT. Said channel is responsible for at least one of: providing stimulus data to and receiving response data from said at least one DUT. In prior art solutions, the entire channel has been under clock control of the channel clock. Said channel clock has been subjected to reprogramming and frequency switching. By implementing an additional service clock domain comprising functional units such as e.g. a memory unit, a sequencer unit, a result processing unit, etc., a more stable and reliable operation of the channel can be accomplished. The service clock remains enabled all the time; it is not subjected to any reprogramming or frequency switching.

Complex DUTs might comprise a variety of internal clock domains. For adjusting the channels of an ATE to a complex DUT of this kind, it might be necessary to switch or reprogram the channel clock, sometimes even during testing. In addition, for performing a so-called speed-binning test, the channel clock frequency might have to be reprogrammed quite frequently, and therefore, it is advantageous to utilize a service clock. A speed binning test allows determining the maximum clock frequency the DUT can deal with. For determining the DUT's maximum clock frequency, the channel clock frequency might be incrementally increased while analyzing the DUT's response signal. As soon as the first errors start to occur, the DUT's maximum clock frequency has been surpassed.

In a preferred embodiment, the channel's drive path provides stimulus data to said at least one DUT in accordance with said channel clock. In yet another preferred embodiment, the channel's receive path receives response data from said at least one DUT in accordance with said channel clock. Hence, the implementation of an additional service clock domain has no impact on the channel's interface to the DUT, which is still controlled by the channel clock. The channel clock controls writing data to the DUT and receiving data from the DUT.

An automated test equipment (ATE) for testing one or more DUTs might comprise one or more channels as described above. Furthermore, said automated test equipment might comprise a central facility, whereby said central facility is responsible for coordinating the channels.

According to a preferred embodiment, the automated test equipment is implemented as centralized tester architecture. The channels are to a large extent controlled by the central facility. For example, the centralized tester architecture might be under clock control of the central facility.

According to an alternative embodiment of the invention, the automated test equipment is implemented according to a tester-per-pin architecture. In this embodiment, only a few tasks are assumed by the central facility. For the most part, the channels act as independent functional units.

The invention can be partly or entirely embodied or supported by one or more suitable software programs, which can be stored on or otherwise provided by any kind of data carrier, and which might be executed in or by any suitable data processing unit. Software programs or routines are preferably applied for controlling the clocks of at least one of the service clock domain and the channel clock domain.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF EMBODIMENTS OF THE INVENTION

Figure 1:
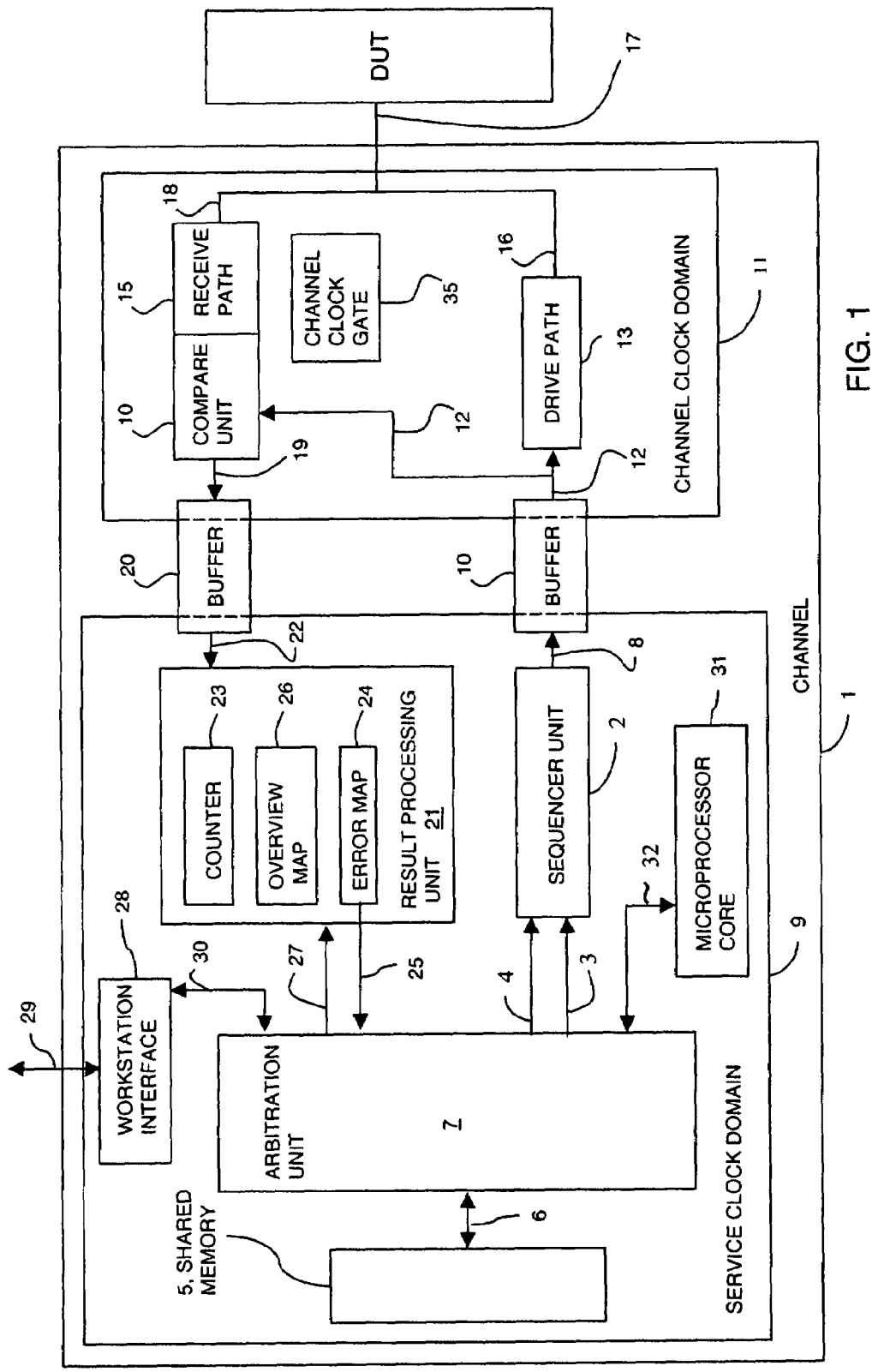
FIG. 1 shows the set-up of a channel.

In FIG. 1, a channel 1 of an automated test equipment (ATE) is shown, whereby the channel 1 is responsible for at least one of: providing stimulus data to a DUT, and analyzing response data obtained from said DUT. The channel 1 does not have to be a channel of an automated test equipment; it might as well be a channel within any kind of multi-channel architecture. The channel 1 comprises a sequencer unit 2 that receives sequencer instructions 3 and sequencer data 4 from a shared memory 5. The shared memory 5 is accessed by an arbitration unit 7. Preferably, the shared memory 5 is implemented as an RDRAM. Instead of a shared memory 5, the channel 1 might as well comprise two ore more separate memory units adapted for storing different kinds of data. For example, the channel 1 might comprise a dedicated memory that is adapted for storing sequencer instructions, in order to allow for a low latency read access.

In accordance with the sequencer instructions 3, the sequencer unit 2 generates a data stream 8. The data stream 8 is written to the first domain crossing buffer 10. The sequencer unit 2, the memory unit 5 and the arbitration unit 7 are part of the service clock domain 9, and for this reason, the data stream 8 is written to the first domain crossing buffer 10 in accordance with the service clock.

The first domain crossing buffer 10 must not get empty, because this might cause a disruption of the channel's output data stream. If the first domain crossing buffer 10 becomes empty, an interrupt will be initiated in order to alert the user. In case the first domain crossing buffer 10 is completely filled, the sequencer unit 2 will stop writing data to the first domain crossing buffer 10. Preferably, the first domain crossing buffer 10 is implemented as a FIFO (First In First Out) buffer.

The first domain crossing buffer 10 is accessed by the functional units of the channel clock domain 11. A data stream 12 is obtained, under clock control of the channel clock, from the first domain crossing buffer 10. The data stream 12 might comprise both drive data and expected data, and for this reason, the data stream 12 is provided both to the drive path 13 and to the compare unit 14 of the receive path 15. The drive path 13 and the receive path 15 are part of the channel clock domain 11. The drive path 13 might comprise a waveform table, which is a look-up table adapted for converting the vectors of the data stream 12 into a corresponding sequence of waveforms. Each waveform comprises a set of edges, together with timing information for said edges. At the output of the drive path 13, a stream of stimulus data 16 is obtained, and said stream of stimulus data 16 is provided to the pin 17 of the DUT.

Alternatively or additionally, a stream of response data 18 might be obtained from the pin 17 of the DUT. In the compare unit 14, the response data 18 is compared with expected data that is transmitted as a part of the data stream 12. The compare unit 14 generates a stream of result data 19 indicating the results of the comparison. Said stream of result data 19 is written, in accordance with the channel clock, to the second domain crossing buffer 20, which is preferably realized as a FIFO buffer. The result data stored in the second domain crossing buffer 20 is read out by the result processing unit 21. The result processing unit 21 is part of the service clock domain 9, and for this reason, the result data stream 22 is obtained in accordance with the service clock. If the result processing unit 21 does not take care of the result data in due time, an overflow of the result processing unit 21 will occur. In this case, an interrupt will be initiated.

The result processing unit 21 comprises a counter 23 that keeps track of the error count. Furthermore, the result processing unit 21 generates an error map 24 by recording the results as a function of the respective cycle. The error map data 25 is written, via the arbitration unit 7, to the shared memory 5. Besides that, the result processing unit 21 generates an overview map 26, with one bit of said overview map representing 4 kByte of result data.

When a DUT is tested, different kinds of errors might occur simultaneously. If only a subset of said errors is to be tracked and analyzed, it will be required to mask out all the other errors. For this purpose, cycle mask data 27 that is read from the shared memory 5 is provided to the result processing unit 21. Said cycle mask data 27 defines those parts of the result data stream 22 that have to be masked out.

The shared memory 5 might e.g. contain sequencer instructions, sequencer data, cycle mask data, result data received from the result processing unit 21, etc. For exchanging the shared memory's content with a workstation, the channel 1 comprises a workstation interface 28 adapted for establishing a data link 29 with the workstation. Said workstation interface 28 is part of the service clock domain 9. Via the workstation interface 28, data 30 can be exchanged between the workstation and the shared memory 5. Said data 30 is routed via the arbitration unit 7. Furthermore, the channel 1 comprises an embedded microprocessor core 31, whereby said microprocessor core 31 is also part of the service clock domain 9. Between the microprocessor core 31 and the shared memory 5, data 32 may be exchanged.

The channel clock domain 11 is under clock control of a channel clock signal, whereby said channel clock signal might e.g. be derived from one of the ATE's master clock signals. The master clock signals are generated on one of the ATE's clock boards. The channel might comprise a frequency divider for converting a master clock signal received from one of the clock boards into the channel clock signal. The frequency of the channel clock signal can be varied within a wide range of frequencies. For example, for analyzing an output signal of an analogue/digital converter (ADC), a channel clock frequency of several kHz might be required. In contrast, for testing a high-speed interface, a channel clock frequency of several hundred MHz might be appropriate. Hence, the clock frequency of the channel clock domain 11 can be adapted to the respective requirements of the DUT.

Before the channel clock frequency may be reprogrammed, the channel should be set to an idle state. Then, the channel clock may be disabled, e.g. by means of a channel clock gate 35. Now, the respective PLL on the clock board can be set to a new frequency, and after a certain transient period, the channel clock might be re-enabled.

When the clock frequency for the channel clock domain 11 is modified, it might become necessary to adjust the time settings of the drive path 13 and/or the receive path 15 to the new clock frequency. For example, the timing of edge transitions might have to be adapted to the new clock period. As soon as the new values of the time settings are available on the part of the channel, the channel clock will be disabled for at least one cycle of the channel clock. During this period of time, the new settings will be written to the respective registers of the channel's drive path and/or receive path. Then, the channel clock signal will be re-enabled. In an ATE, this procedure can be performed under control of a central facility. If said central facility receives an "Edge Generate Ready" (EGR) message from a certain channel, it will in turn disable the respective channel clock signal by deactivating the signal "Master Clock Enable" (MCEN) until the new settings have been written to the corresponding registers. Then, the signal "Master Clock Enable" is reactivated, and thus, the channel clock is re-enabled.

The service clock domain 9 is under clock control of the service clock. For generating said service clock signal, a reference clock signal is provided to the channel by the ATE's control board, whereby the frequency of said reference clock signal might e.g. be in the order of 20 MHz. The channel comprises an internal PLL adapted for deriving a service clock signal from said reference clock signal, whereby the frequency of the service clock signal might e.g. be within the range from 100 to 500 MHz. Hence, the service clock signal is generated in a completely different manner than the channel clock signal. For this reason, the service clock and the channel clock are completely independent from each other.

The invention claimed is:

1. An automated test equipment for testing at least one device under test, said equipment comprising:
   a central tester comprising a memory, a sequencer and a result processing unit, wherein the central tester operates on the basis of a service clock;
   at least one channel comprising a drive path and a receiver path, wherein the channel is adapted for providing a stream of stimulus data to the at least one device under test and for receiving a stream of response data therefrom, wherein the channel operates on the basis of a channel clock which is independent from the service clock;
   a first buffer arranged between the sequencer and the drive path; and
   a second buffer arranged between the receive path and the result processing unit.

2. The equipment according to claim 1, wherein the central tester is adapted for at least one of: providing data to and receiving data from the channel clock domain at a data rate that exceeds the data rate of the channel clock domain.

3. The equipment of claim 1, wherein said central tester comprises at least one of: a sequencer unit, a memory unit, preferably a dynamic RAM, a microprocessor core, a result processing unit, and an interface module adapted for establishing a data link between the channel and a central facility.

4. An automated test equipment for testing at least one device under test, said equipment comprising:
   a central tester comprising a memory, a sequencer and a result processing unit, wherein the central tester operates on the basis of a service clock;
   at least one channel comprising a drive path and a receiver path, wherein the channel is adapted for providing a stream of stimulus data to the at least one device under test and for receiving a stream of response data therefrom, wherein the channel operates on the basis of a channel clock which is independent from the service clock;
   a first buffer arranged between the sequencer and the drive path;
   a second buffer arranged between the receive path and the result processing unit; and
   a channel clock gate adapted for disabling said channel clock.

5. An automated test equipment for testing at least one device under test, said equipment comprising:
   a central tester comprising a memory, a sequencer and a result processing unit, wherein the central tester operates on the basis of a service clock;
   at least one channel comprising a drive path and a receiver path, wherein the channel is adapted for providing a stream of stimulus data to the at least one device under test and for receiving a stream of response data therefrom, wherein the channel operates on the basis of a channel clock which is independent from the service clock;
   a first buffer arranged between the sequencer and the drive path; and
   a second buffer arranged between the receive path and the result processing unit,
   wherein said central tester is adapted for providing data via the first buffer to of the drive path and to a compare unit of the receive path, wherein said first buffer is realized as a FIFO buffer.

6. The equipment according to claim 5, wherein writing data to said first buffer is performed under clock control of said service clock, and wherein reading data from said first buffer is performed under clock control of said channel clock.

7. The equipment according to claim 5, wherein said equipment is adapted for initiating an interrupt in case said first buffer becomes empty.

8. An automated test equipment for testing at least one device under test, said equipment comprising:
   a central tester comprising a memory, a sequencer and a result processing unit, wherein the central tester operates on the basis of a service clock;
   at least one channel comprising a drive path and a receiver path, wherein the channel is adapted for providing a stream of stimulus data to the at least one device under test and for receiving a stream of response data therefrom, wherein the channel operates on the basis of a channel clock which is independent from the service clock;
   a first buffer arranged between the sequencer and the drive path; and
   a second buffer arranged between the receive path and the result processing unit,
   wherein said receive path is adapted for providing result data via the second buffer to said central tester, wherein said second buffer is realized as a FIFO buffer,
   and wherein writing result data to said second buffer is performed under clock control of said channel clock, and wherein reading result data from said second buffer is performed under clock control of said service clock.

9. The equipment according to claim 8, wherein said equipment is adapted for initiating an interrupt in case said second buffer is completely filled.

10. An automated test equipment for testing at least one device under test, said equipment comprising:
    a central tester comprising a memory, a sequencer and a result processing unit, wherein the central tester operates on the basis of a service clock;
    at least one channel comprising a drive path and a receiver path, wherein the channel is adapted for providing a stream of stimulus data to the at least one device under test and for receiving a stream of response date therefrom, wherein the channel operates on the basis of a channel clock which is independent from the service clock;
    a first buffer arranged between the sequencer and the drive path; and
    a second buffer arranged between the receive path and the result processing unit,
    wherein said sequencer unit is connected via said at least one first buffer with at least one of said drive path and to a compare unit of said receive path.

11. An automated test equipment for testing at least one device under test, said equipment comprising:
    a central tester comprising a memory, a sequencer and a result processing unit wherein the central tester operates on the basis of a service clock;
    at least one channel comprising a drive path and a receiver path, wherein the channel is adapted for providing a stream of stimulus data to the at least one device under test and for receiving a stream of response data therefrom, wherein the channel operates on the basis of a channel clock which is independent from the service clock;
    a first buffer arranged between the sequencer and the drive path; and
    a second buffer arranged between the receive path and the result processing unit,
    wherein the sequencer unit is adapted to stop writing data to said first buffer in case said first buffer is completely filled.

* * * * *